March 24, 1970 D. J. SIKORRA 3,502,998
TRANSFORMERLESS AC/DC REFLEX AMPLIFIER
Filed Aug. 27, 1965
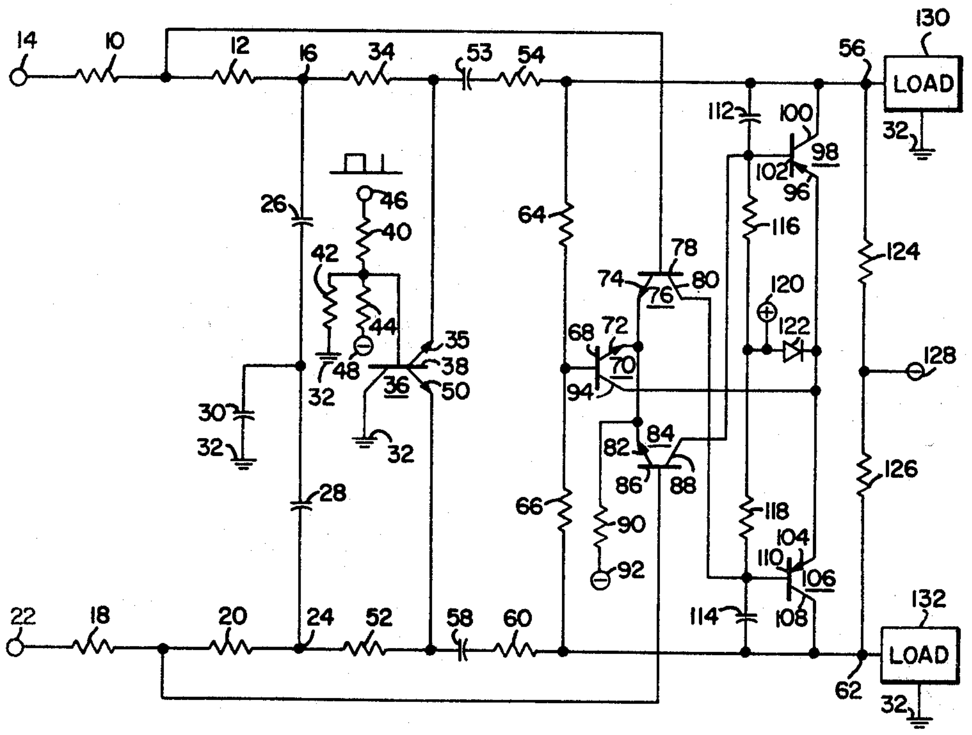
INVENTOR.
DANIEL J. SIKORRA
BY Bruce C Lutz
ATTORNEY United States Patent Office 3,502,998

Patented Mar. 24, 1970

3,502,998

TRANSFORMERLESS AC/DC REFLEX AMPLIFIER

Daniel J. Sikorra, Champlin, Minn., assignor to Honeywell Inc., Minneapolis, Minn., a corporation of Delaware Filed Aug. 27, 1965, Ser. No. 483,067
Int. Cl. H03f 3/68
U.S. Cl. 330—30 9 Claims

ABSTRACT OF THE DISCLOSURE

A transformerless AC/DC reflex amplifier. An input AC signal is amplified using an AC amplifier stage and is demodulated and returned to the same stage where it is then amplified again.

The invention described herein was made in the performance of work under a NASA contract and is subject to the provisions of Section 305 of the National Aeronautics and Space Act of 1958, Public Law 85–568 (72 Stat. 435; 42 U.S.C. 2457).

The present invention pertains generally to amplifiers and more specifically to an amplifier which converts alternating signals to direct signals and in the process uses the amplifying section twice.

In using the same amplifying section for amplifying both the alternating and direct voltage signals, more economical use is made of the amplifying tubes or transistors thereby increasing reliability through the use of a lesser number of components and reducing the cost for the same reason. At the same time that reliability is increased and cost is reduced, the gain of the entire unit is very greatly increased.

Various objects and advantages of this invention will be apparent from a reading of the specification and appended claims in conjunction with the single figure which is a circuit diagram of one embodiment of the invention.

Two resistors, 10 and 12 are connected in series between an input terminal 14 and a junction point 16. Two more resistors 18 and 20 are connected in series between a second input terminal 22 and a junction point 24. Two capacitors 26 and 28 are connected in series between junction point 16 and 24. A third capacitor 30 is connected to a junction point between the two capacitors 26 and 28 and ground or reference potential 32. A resistor 34 is connected between junction point 16 and an emitter 35 of a double emitter NPN transistor generally numbered 36 having a collector connected to ground 32 and a base 38. Transistor 36 is one element in a signal converting or demodulator section of the invention. Three resistors 40, 42 and 44 are each connected at one end to base 38. The other end of resistor 40 is connected to an input terminal 46 for supplying a switching signal. The other end of resistor 44 is connected to a negative power terminal 48 (source not shown). The other end of resistor 42 is connected to ground 32.

The second emitter 50 of transistor 36 is connected to one end of a resistor 52 which has its other end connected to junction point 24. A capacitor 53 is connected in series with a resistor 54 between emitter 35 and a first output terminal 56 for the overall amplifier unit. A capacitor 58 is connected in series with a resistor 60 between emitter 50 and a second output terminal 62 of the overall amplifier unit. Resistors 64 and 66 are connected between output terminals 56 and 62, and a junction point between these two resistors is connected to a base 68 of an NPN transistor generally designated as 70. An emitter 72 of transistor 70 is connected to an emitter 74 of an NPN transistor normally designated as 76 having a base 78 and a collector 80, and also to an emitter 82 of an NPN transistor normally designated as 84 having a base 86 and a collector 88. A resistor 90 is connected between emitter 82 and a negative power terminal 92 which may be the same as terminal 48.

A collector 94 of transistor 70 is connected to an emitter 96 of a PNP transistor generally designated as 98 having a collector 100 and a base 102 and is also connected to an emitter 104 of a PNP transistor generally designated as 106 having a collector 108 and a base 110. Collectors 100 and 108 are connected to output terminals 56 and 62 respectively. A frequency response shaping capacitor 112 is connected between terminal 56 and base 102 while a similar capacitor 114 is connected between base 110 and terminal 62. Two resistors 116 and 118 are connected in series between base 102 and base 110 with a junction point therebetween connected to a positive power terminal 120 (source not shown). A diode 122 is connected between terminal 120 and emitter 104 such that the direction of easy current flow is towards emitter 104. Collector 88 is connected to base 102 while collector 80 is connected to base 110. Two resistors 124 and 126 are connected in series between terminals 56 and 62 with a junction point therebetween connected to a negative terminal 128 which may be the same as terminal 48.

A first load impedance 130 is connected between output 56 and ground 32 while a second load 132 is connected between output 62 and ground 32. The two loads 130 and 132 may physically be a single unit with a two terminal input of as shown pictorially.

In operation a switching signal is applied to terminal 46 which is utilized to switch transistor 36 between ON and OFF conditions and provide a demodulating action. Upon each occurrence and the positive polarity pulse being applied to base 38, the two emitters 35 and 50 are connected to ground 32 so as to act much like a "shunt" demodulator.

An input signal may be applied to either one of the two input terminals 14 and 22 with the other input terminal being grounded. This input signal is an alternating signal which is applied to either one of the bases 78 and 86. The signal is not applied directly to the output terminals 56 and 62 because of the filtering action of capacitors 26, 28, and 30 in conjunction with the resistors connected thereto. Since transistors 76 and 84 are connected in the form of a differential amplifier, outputs will be obtained on both collectors whether there is a single input signal or whether there are two input signals. This is the reason for the statement in the beginning of this paragraph that either one or two signals could be applied to the input terminals. The signals applied to bases 78 and 86 are amplified and applied respectively to transistors 106 and 98 to provide inverted terminals 56 and 62. However, these alternating signals will be applied back through capacitors 53 and 58 to the previously mentioned demodulator utilizing transistor 36. The phase of the signal applied to terminal 46 is the same as (or opposite) the phase of the input signals to be amplified. Thus, one half of each cycle is eliminated and a reversible direct current signal is obtained which is applied back through low pass filter utilizing the resistors 34, 12, 52, and 20 to the bases 78 and 86. The direct signals are not applied to outputs 56 and 62 directly because of the blocking capacitors 53 and 58. This direct signal acts much like a change in bias to the various transistors and results in a change in direct voltage levels appearing at output terminals 56 and 62. However, amplification does take place through transistors 76, 84, 98, and 106 to provide a gain of approximately 1,000 in one embodiment of the invention over the gain obtained when the demodulator is disconnected so that the amplifier only amplifies the alternating signals. If the output signals appearing at terminals 56 and 62 are not exactly of the same amplitude and of opposite polarity, transistor 70 will react to a signal obtained indicating an error in the relative amplitudes of the two output signals and thereby alter the biasing level of transistors 76 and 84 to correct for this discrepancy.

While the alternating signal applied to the demodulating section is also applied to loads 130 and 132, the effect is negligible as compared with the resultant direct voltage signal. This effect is obtained due to the subsequent amplification of the demodulated signal so that the amplitude in one embodiment of the alternating signal was less than 1% as compared with direct voltage.

While throughout these specifications the resistors have been called resistance means and the transistors have been called transistors by type or polarity, to provide clarity in the specification it is obvious that in some instances the resistors or capacitors could be other impedance means such as inductors and that the transistors could just as well be tubes or other current or voltage amplifying means. It is equally clear that the switching transistors can be replaced by valves or other switching type units, and I do not intend to be limited by the specific words used in the specification, but only by the scope of the appended claims in which I claim:

1. Apparatus of the class described comprising, in combination:

amplifying means including input means and output means;

high pass filter means connected to said output means of said amplifying means;

signal converting means connected to said high pass filter for receiving alternating signals therefrom;

input signal supplying means for supplying an alternating signal; and feedback means connected to said input signal supplying means, to said input means of said amplifying means and to said signal converting means for receiving signals from said input signal supplying means and said signal converting means, and for blocking alternating components of signals supplied by said signal converting means and for applying them to said input means of said amplifying means.

2. The invention as defined in claim 1 in which the signal converting means is a demodulator.

3. The invention of claim 2 wherein the demodulator receives only alternating signals from said amplifying means and supplies direct current signals to said amplifying means.

4. Apparatus as defined in claim 1 wherein the amplifying means is a differential amplifier.

5. Apparatus as defined in claim 3 wherein the amplifying means is a differential amplifier comprising first and second and third transistors each including input, common and output means, the common means of each of the said transistors being connected together, the input means of said first and second transistors being connected to said input means of said amplifier, and said input means of said third transistor being connected to said output means of said amplifier, said third transistor providing common mode rejection and equalizing the amplitude of differential output signals obtained from said amplifier and said amplifier providing initial alternating signal amplification before demodulation and later providing direct signal amplification.

6. The invention as defined in claim 1 wherein a load impedance is connected to said output means of said amplifying means.

7. The invention of claim 5 wherein a load is connected to said output means of said differential amplifier.

8. A transformerless reflex circuit comprising, in combination:

first and second circuit input means at least one of which supplying a high frequency alternating input signal to be amplified;

first and second amplifying means connected to form a differential amplifier, said first and second amplifying means each including an input connected respectively to said first and second circuit input means and each including output means;

first and second demodulator circuit means each including input means and output means;

means connecting said output means of said first and second amplifying means respectively to said input means of said first and second demodulator circuit means to supply alternating signals thereto;

means connecting said output means of said first and second demodulator circuit means to said input means of said second and said first amplifying means respectively for supplying a low frequency signal to be amplified thereto, a filtering action in the demodulating circuit means preventing receipt by said last mentioned connecting means of high frequency signals from said amplifying means; and circuit output means connected to said output means of said first and second amplifying means for supplying low frequency output signals to a load means.

9. The invention defined in claim 8 wherein the low frequency signal is a direct voltage signal, the amplifying means are solid state devices, the differential amplifier includes a plurality of stages, and a third solid state device is connected to said first and second amplifying means for detecting unbalanced output signals from said differential amplifier and supplying corrective signals to said first and second amplifying means to rebalance said differential amplifier.

References Cited

UNITED STATES PATENTS

| | | | |
|---|---|---|---|
| 2,916,616 | 12/1959 | Boscia | 329—192 X |
| 3,204,190 | 8/1965 | Broadhead | 329—192 X |
| 3,275,945 | 9/1966 | Walker et al. | 330—30 |

ROY LAKE, Primary Examiner

L. J. DAHL, Assistant Examiner

U.S. Cl. X.R.

330—26